US006649935B2

(12) United States Patent
Hsu et al.

(10) Patent No.: US 6,649,935 B2
(45) Date of Patent: Nov. 18, 2003

(54) SELF-ALIGNED, PLANARIZED THIN-FILM TRANSISTORS, DEVICES EMPLOYING THE SAME

(75) Inventors: Louis L. Hsu, Fishkill, NY (US); Jack Allan Mandelman, Stormville, NY (US); William Robert Tonti, Essex Junction, VT (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/795,535

(22) Filed: Feb. 28, 2001

(65) Prior Publication Data

US 2002/0117717 A1 Aug. 29, 2002

(51) Int. Cl.[7] .................. H01L 29/76; H01L 31/036; H01L 31/112
(52) U.S. Cl. .............. 257/67; 257/69; 257/70
(58) Field of Search .......... 257/67, 351, 365, 257/368, 369, 69, 70, 74

(56) References Cited

U.S. PATENT DOCUMENTS

| | | | |
|---|---|---|---|
| 4,654,121 A | * 3/1987 | Miller et al. .............. 257/70 |
| 4,997,785 A | * 3/1991 | Pfiester .................. 438/153 |
| 5,095,304 A | * 3/1992 | Young .................... 345/208 |
| 5,298,782 A | 3/1994 | Sundaresan ............... 257/393 |
| 5,413,948 A | 5/1995 | Pfiester et al. ............. 437/41 |
| 5,567,958 A | 10/1996 | Orlowski et al. ........... 257/66 |
| 5,573,964 A | 11/1996 | Hsu et al. ................ 437/40 |
| 5,616,934 A | 4/1997 | Dennison et al. ........... 257/67 |
| 5,625,200 A | * 4/1997 | Lee et al. ................ 257/350 |
| 5,654,572 A | 8/1997 | Kawase .................. 257/371 |
| 5,700,705 A | 12/1997 | Meguro et al. ............. 437/52 |
| 5,841,199 A | 11/1998 | Yang .................... 257/903 |
| 5,872,029 A | * 2/1999 | Gardner et al. ............ 438/152 |
| 5,886,375 A | 3/1999 | Sun ..................... 257/296 |
| 5,965,905 A | 10/1999 | Hayashi ................. 257/60 |
| 6,022,766 A | 2/2000 | Chen et al. .............. 438/152 |
| 6,030,865 A | 2/2000 | Hashimoto et al. ......... 438/238 |
| 6,091,628 A | 7/2000 | Kim .................... 365/154 |

FOREIGN PATENT DOCUMENTS

| | | | |
|---|---|---|---|
| JP | 5-182985 | 7/1993 | ........ H01L/21/336 |
| JP | 11-26753 | * 1/1999 | |

OTHER PUBLICATIONS

"High Density Sram Structure With a New Three Dimensional, High–Performance, High–Packing Density, Planar Inverter Design", IBM Technical Disclosure Bulletin, Jul. 1991, pp. 255–258.

* cited by examiner

Primary Examiner—Thien Tran
(74) Attorney, Agent, or Firm—William D. Sabo, Esq.; Kevin P. Radigan, Esq.; Heslin Rothenberg Farley & Mesiti P.C.

(57) ABSTRACT

A semiconductor device is presented which includes a self-aligned, planarized thin-film transistor which can be used in various integrated circuit devices, such as static random access memory (SRAM) cells. The semiconductor device has a first field-effect transistor and a second field-effect transistor. The second field-effect transistor overlies the first field-effect transistor, and the first field-effect transistor and the second field-effect transistor share a common gate. The second field-effect transistor includes a source and a drain which are self-aligned to the shared gate in a layer of planarized seminconductor material above the first field-effect transistor. In one embodiment, the second field-effect transistor is a thin-film transistor, and the shared gate has a U-shape wrap-around configuration at a body of the thin-film transistor.

29 Claims, 16 Drawing Sheets

SELF-ALIGNED, PLANARIZED THIN-FILM TRANSISTORS, DEVICES EMPLOYING THE SAME

TECHNICAL FIELD

The present invention relates in general to semiconductor devices and methods of fabrication, and more particularly to a thin-film transistor structure (TFT) and novel processes for creating the same. The thin-film transistor structure can be used in various integrated circuit devices, such as static random access memories (SRAMs).

BACKGROUND OF THE INVENTION

Thin-film transistors are field-effect transistors (FETs) that offer major cost and density advantages. However, TFTs have certain undersirable characteristics such as low gain and high off-state leakage current. Unlike a conventional FET where the source, drain and channel regions are formed in the body of a single crystalline substrate, the device regions of a TFT typically are formed in a polysilicon or amorphous silicon layer (device layer) overlying a substrate. Since the polysilicon layer is formed at a relatively lower temperature, and need not be in the body of the single crystal substrate, the device regions of the TFT can be formed above the substrate to create stacked transistors, which is an advantage that provides greater density and lower costs. TFTs are often used in flat panel displays as switching transistors and in static random access memories (SRAMs) as load devices.

Since the device polysilicon layer (channel layer) is conventionally not part of the substrate, a gate insulator and electrode can be positioned over the channel layer (top-gate TFT), or under the channel layer (bottom-gate TFT). Whereas both top-gated and bottom-gated TFTs have been used in SRAMs, bottom-gated TFTs are more popular since they lead to greater packing density. Unfortunately, the conventional bottom-gated TFT suffers certain disadvantages by requiring (1) an extra mask since source and drain regions are defined by topography masking techniques, and (2) drain off-sets that are lithographically defined and hence not self-aligned and symmetrical. These fabrication requirements cause inconsistent "on" and "off" currents. Drain off-sets are a desired feature in TFTs and are simply lightly doped regions placed outside the edge of the gate conductor, somewhat similar to lightly doped drain (LDD) FETs. Drain off-sets reduce punch-through problems and reduce the off-state leakage current.

TFT structures are described in various references in the art. For example, reference U.S. Pat. No. 5,573,964, which is hereby incorporated herein by reference in its entirety. This commonly-assigned patent describes a method of making a thin-film transistor (TFT) on a substrate with an insulating surface layer. A layer of dopant source is deposited on the insulating layer, followed by the defining of a gate stack comprising a gate polysilicon, gate insulator and a protective polysilicon using the dopant source layer as an etch stop. Sidewall spacers are formed in contact with the gate stack. A TFT body polysilicon is deposited and patterned, forming thereby the source and drain regions in a self-aligned manner. By heating, the dopants from the dopant source layer are driven into the source/drain and to part of the off-set regions of the body polysilicon layer while simultaneously also doping the gate polysilicon. Although providing an improved manufacturing process for a TFT with improved yield and reliability, as well as employing a self-aligned process for forming the source and drain regions of the TFT, further TFT structure and manufacturing enhancements over this approach are still believed commercially desirable.

DISCLOSURE OF THE INVENTION

High density SRAM memory structures comprising pull-up load transistors (e.g. PMOS), made by thin-film transistors (TFT) lying on top of pull-down devices (e.g. NMOS), typically have a non-planar surface. For example, the top surface of the gate is typically higher than the gate surface of the support devices. Extra processes must then be performed to planarize such a topography so that high quality metal interconnect can be realized to achieve high-density integration. By way of example, the above-referenced U.S. Pat. No. 5,573,964 describes TFT devices formed on top of a gate structure. The gate structure comprises a doped substrate and doped sidewall spacers. The source/drain of the TFT is formed by dopants out-diffusing from these doped substrate and sidewalls. As a result, the source/drain of the TFT device is self-aligned to the gate. Unfortunately, the non-planar topology still means low yield. Also, since the TFT is butted to the underlying active device, separation of the two devices is difficult.

Damascene gate processing has become more and more popular, especially for forming deep-sub-micron devices with a planar surface. One unique aspect of the damascene gate process is that the source/drain of the device is formed first using a dummy gate structure. The gate dielectric and gate conductors are formed afterward. As a result, the gate dielectric is subjected to less thermal cycling. Conventional polysilicon gate semiconductors can be replaced with a low-resistive metal, with a melting point which may be lower than the doped polysilicon. Also, when the dummy gate is removed, a channel implant can be conducted in a self-aligned manner so as to reduce the parasitic capacitance. After the gate is formed, a planar topology is obtained by a chemical-mechanical polish, thereby readying the structure for the following metal interconnect layers.

In view of the above, presented herein is a transistor fabrication approach which employs a dual damascene process to form, in one embodiment, a high-density SRAM memory cell. As one example, the cell may comprise thin-film pull-up devices, NMOS pull-down devices and transfer devices. In addition, a fabrication approach is presented which integrates the process steps for forming SRAM cell devices, and the support devices, wherein the support devices are formed by a single damascene process and the SRAM memory cell devices are formed by a standard damascene or dual damascene process. That is, the TFT devices are formed on top of the pull-down devices and share the same gate conductors. In another aspect, the thin-film transistors presented herein provide a planar surface immediately after the devices are fabricated, where the planar surface is ready for metal interconnect without additional chemical mechanical polishing. In the embodiments described, an upper surface of the TFT gate is coplanar to the gate of the support devices, and the upper surface of the source region, body region and drain region are all coplanar. (Note that the support devices can comprise NMOS and PMOS devices for support circuits, such as decoders, sense amplifiers, word-line drivers, etc. The support devices are typically outside of the memory arrays.) Presented herein is a novel SRAM memory cell structure in which the TFT gate is formed on top of the pull-down NMOS device with a self-aligned source/drain doping from the surrounding doped dielectric material.

The above-summarized objects and advantages are realized herein in one aspect through the provision of a semiconductor device which includes a first field-effect transistor and a second field-effect transistor. The first field-effect transistor has a first source, a first drain and a gate, while the second field-effect transistor has a second source, a second drain and a gate, wherein the gate is shared by the first transistor and the second transistor. In addition, the second source and the second drain are self-aligned to the gate in a layer of planarized semiconductor above the first field-effect transistor.

In another aspect, presented herein is a semiconductor device which includes a first field-effect transistor and a second field-effect transistor. The first field-effect transistor has a first source, a first drain and a gate. The second field-effect transistor has a second source, a second drain and a gate, where the gate is shared by the first transistor and the second transistor. Further, the gate comprises a U-shaped, wrap-around gate for the second field-effect transistor.

In still another aspect, a semiconductor device is presented which includes a masking structure and a semiconductor material layer disposed over the masking structure. The device further includes a doped dielectric layer adjacent to the semiconductor material. The semiconductor material is doped self-aligned to the masking structure from the doped dielectric layer. In a PMOS thin-film transistor (TFT) embodiment, the dielectric material is heavily doped with p type dopants.

Various methods of fabricating the above-summarized semiconductor devices are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings in which:

BEST MODE FOR CARRYING OUT THE INVENTION

Figure 1A:
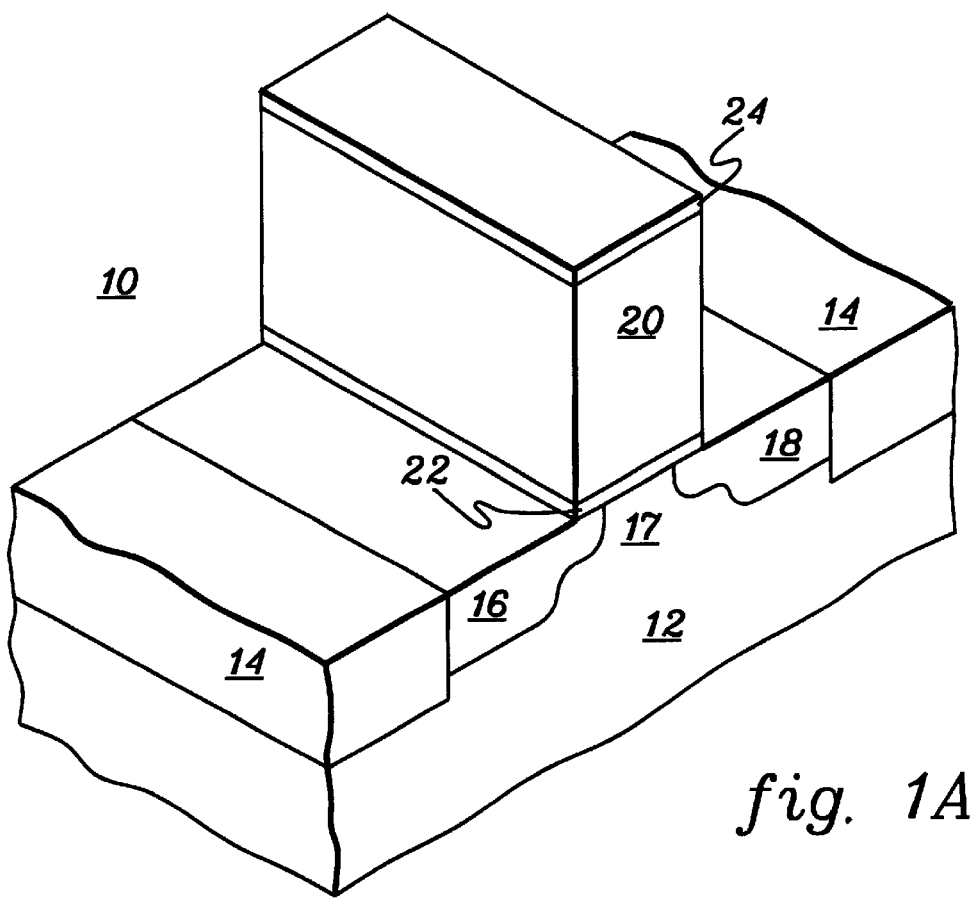
FIG. 1A with a partial perspective view of a field-effect transistor structure.
Figure 1B:
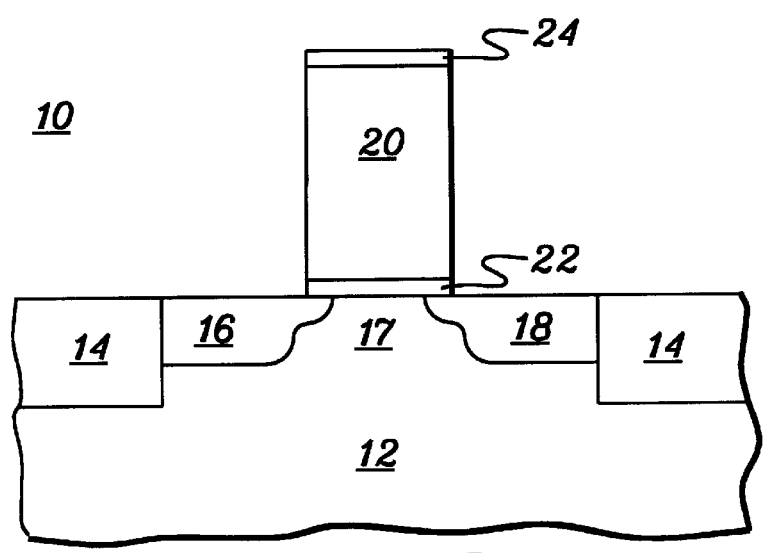
FIG. 1B is an elevational view of the field-effect transistor structure of FIG. 1A.

FIGS. 1A & 1B depict a field-effect transistor structure, generally denoted 10, obtained in a fabrication process in accordance with the principles of the present invention. Transistor structure 10 comprises a semiconductor substrate 12, having shallow trench isolation regions 14, and a source region 16, a drain region 18 and a gate 20. Gate 20 is separated from a channel 17 disposed between source 16 and drain 18 by a gate dielectric 22, such as a thin thermal oxide. A nitride layer 24 is disposed upon gate 20 and comprises a protective dielectric layer.

Figure 2A:
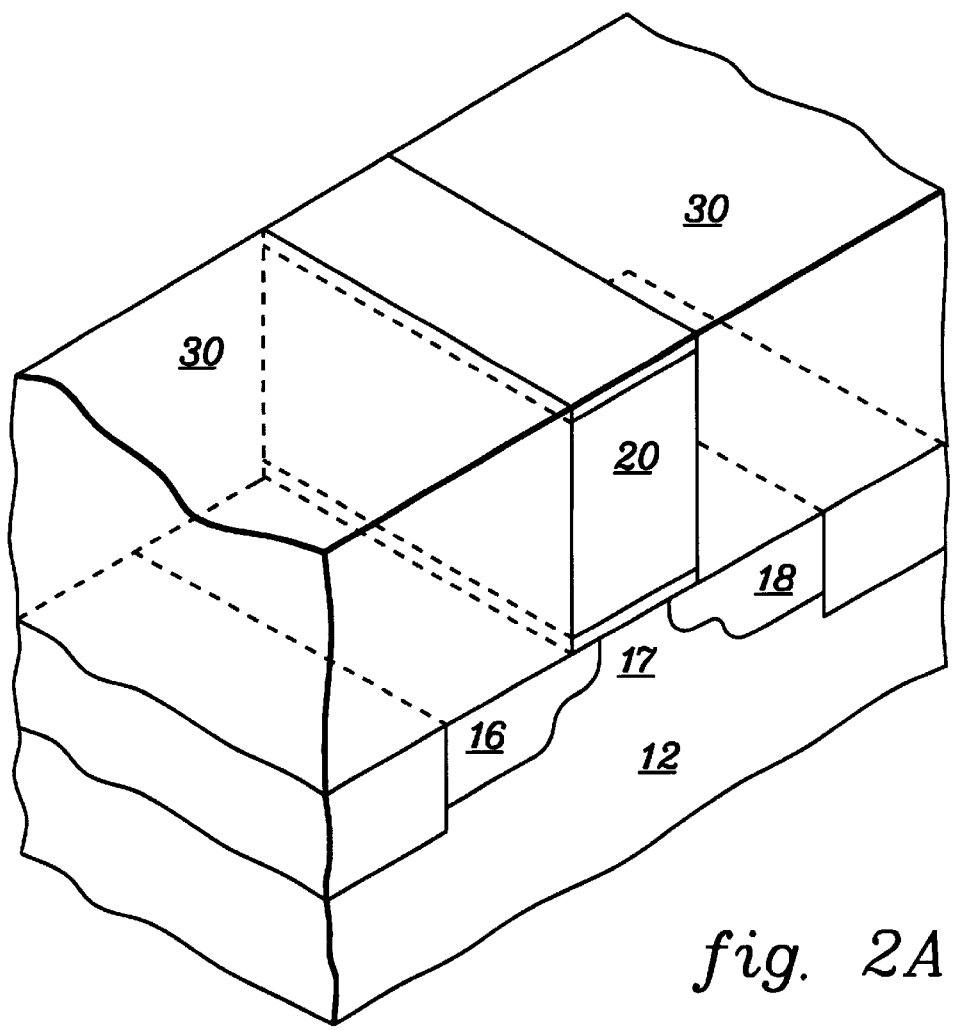
FIG. 2A is partial perspective view of the field-effect transistor structure of FIG. 1A after dielectic material has been formed and polished in accordance with one aspect of the present invention.
Figure 2B:
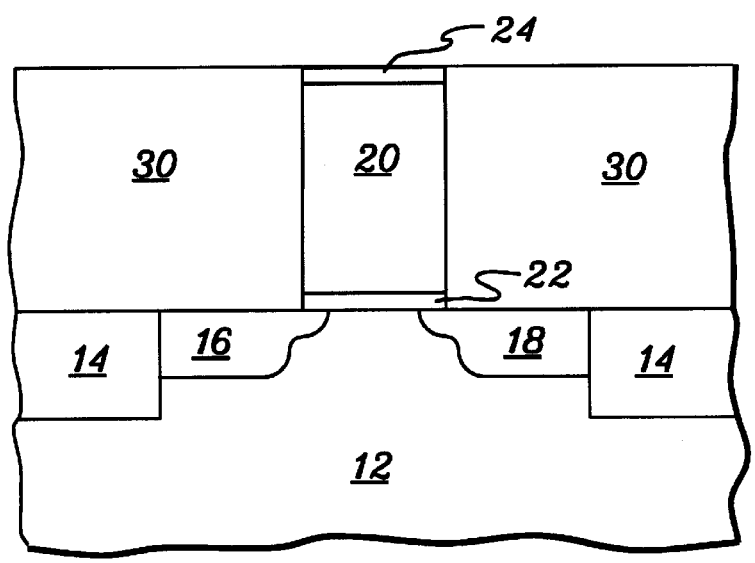
FIG. 2B is an elevational view of the structure of FIG. 2A.

In FIGS. 2A & 2B, structure 10 of FIG. 1A is shown covered with a dielectric material 30, such as boron doped glass (BSG), which has been planarized back to the surface of nitride 24 atop the gate stack.

Figure 3A:
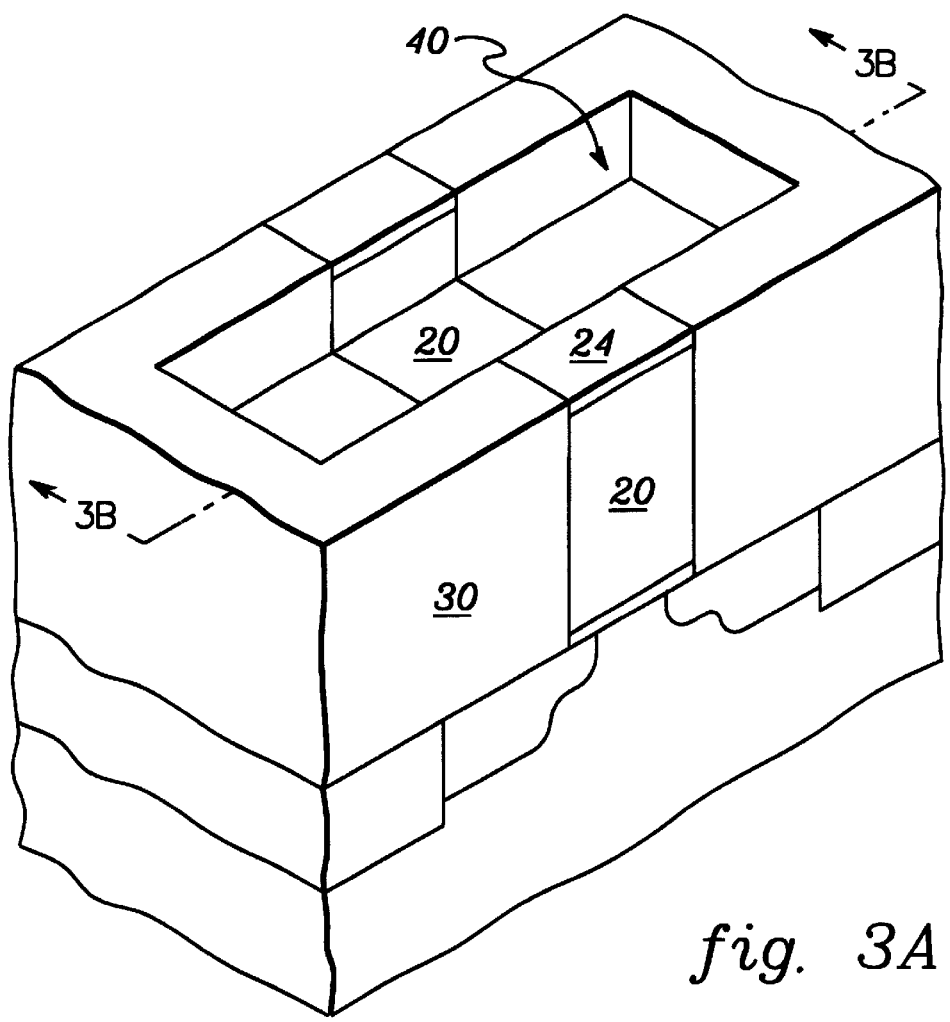
FIG. 3A is a partial perspective view of the structure of FIG. 2A after etching of a trench transverse to the gate structure in accordance with the principles of present invention.
Figure 3B:
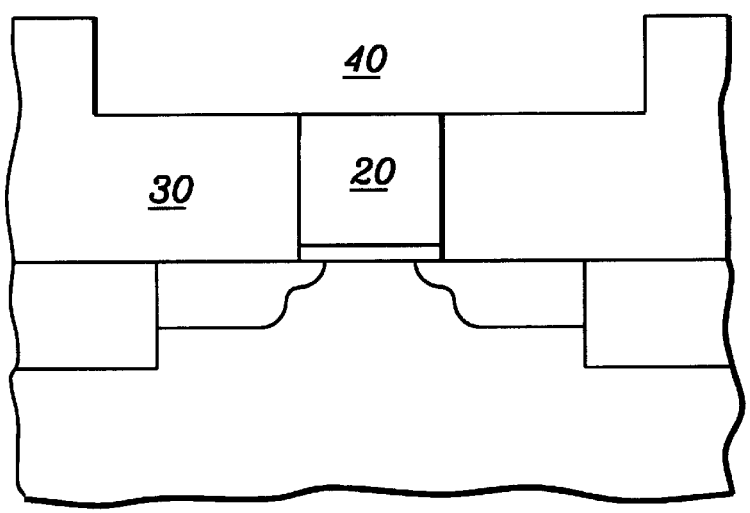
FIG. 3B is a cross-sectional view of the structure of FIG. 3A taken along line 3B—3B.

The gate stack and the doped dielectric are next selectively etched back using a mask to form a trench 40 as depicted in FIGS. 3A & 3B, within which the thin-film transistor is to be formed. In this embodiment, trench 40 extends transverse to the gate stack. Note that the depth of trench 40 may vary, but that a portion of gate 20 must remain exposed within the trench. For example, in FIG. 1A, gate 20 may have a depth in the range of 1200 to 3000 Angstroms, and trench 40 (FIG. 3A) may extend half-way through the gate.

Figure 4A:
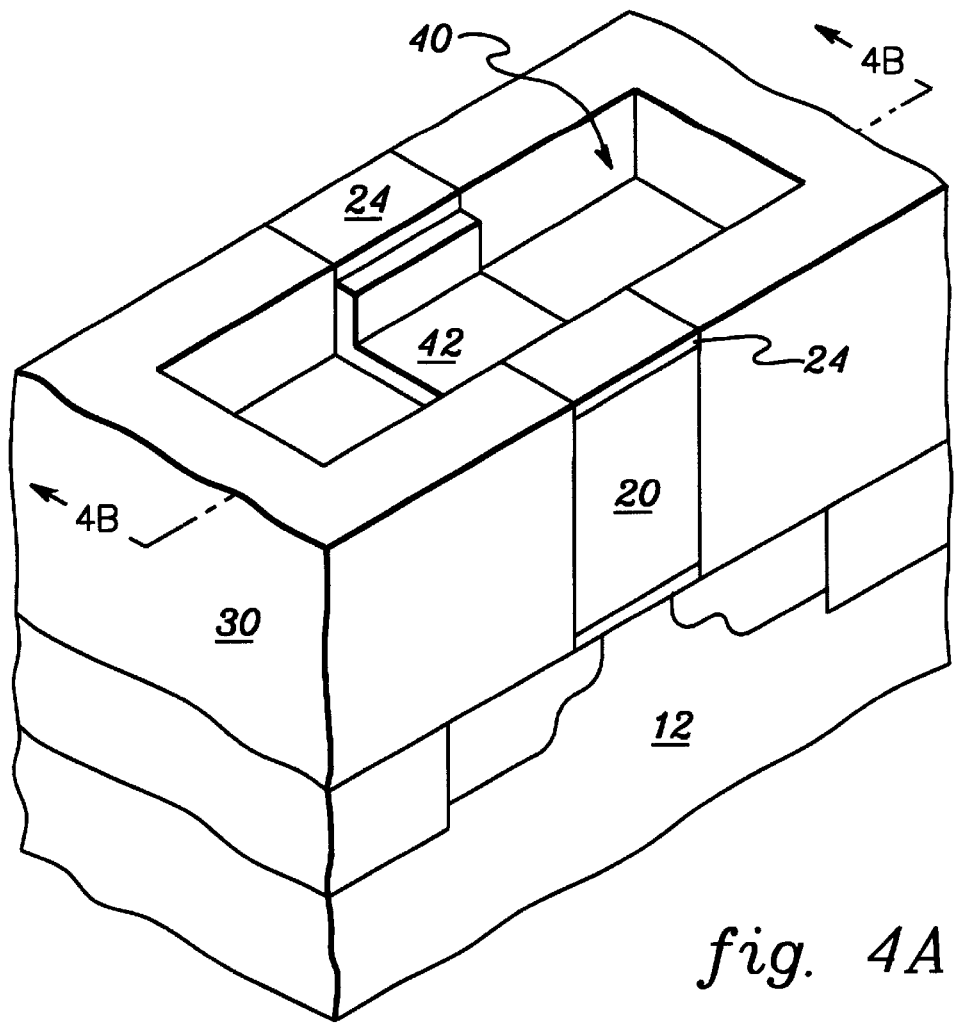
FIG. 4A is a partial perspective view of the structure of FIG. 3A after formation of a gate dielectric for the thin-film transistor to be fabricated in accordance with the present invention.
Figure 4B:
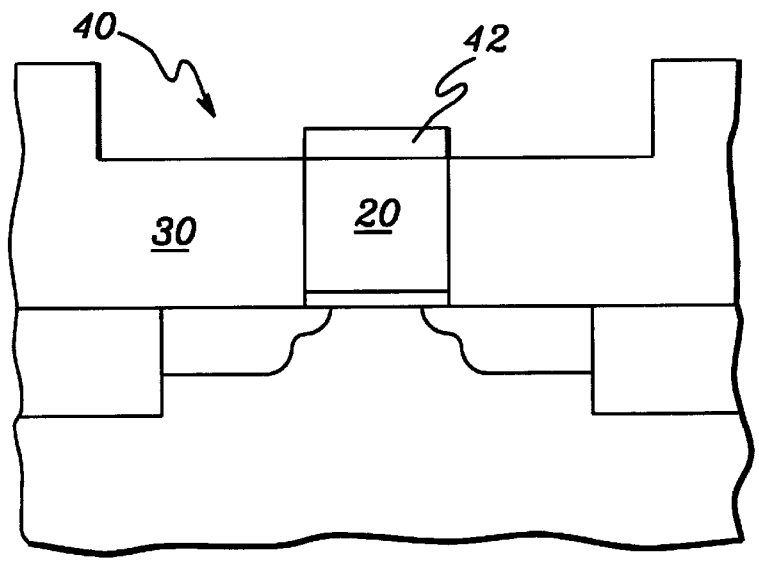
FIG. 4B is a cross-sectional view of the structure of FIG. 4A taken along line 4B—4B.

As shown in FIGS. 4A & 4B, an oxide layer 42 is next grown on the exposed polysilicon 20 of the gate to form a gate dielectric (for the thin-film transistor to reside within trench 40). Note that oxide 42 resides on the planar exposed surface of gate 20 as well as the exposed sidewall surfaces of gate 20 within trench 40. The oxide layer does not grow on the dielectric layer 24.

Figure 5A:
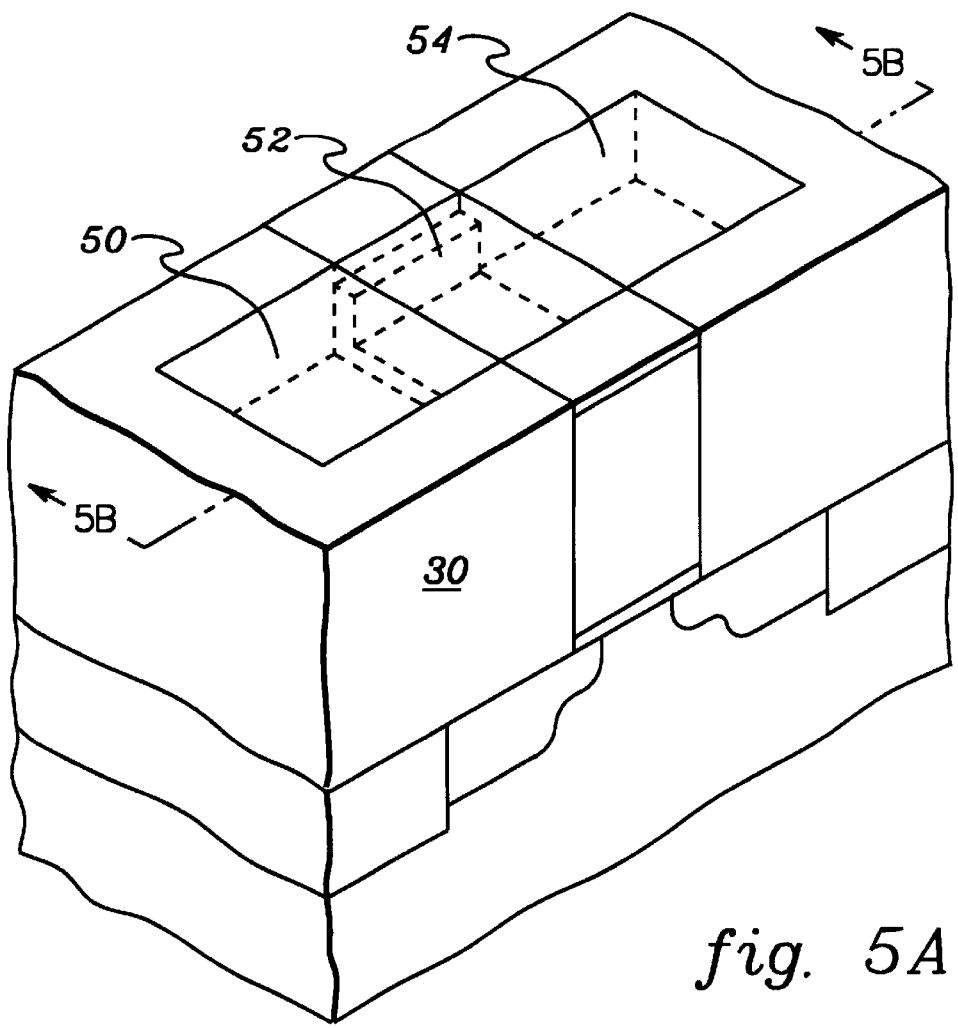
FIG. 5A is a partial perspective view of the structure of FIG. 4A after polysilicon has been deposited within the trench and polished in accordance with the present invention to an upper surface co-planar with the dielectric material surrounding the gate.
Figure 5B:
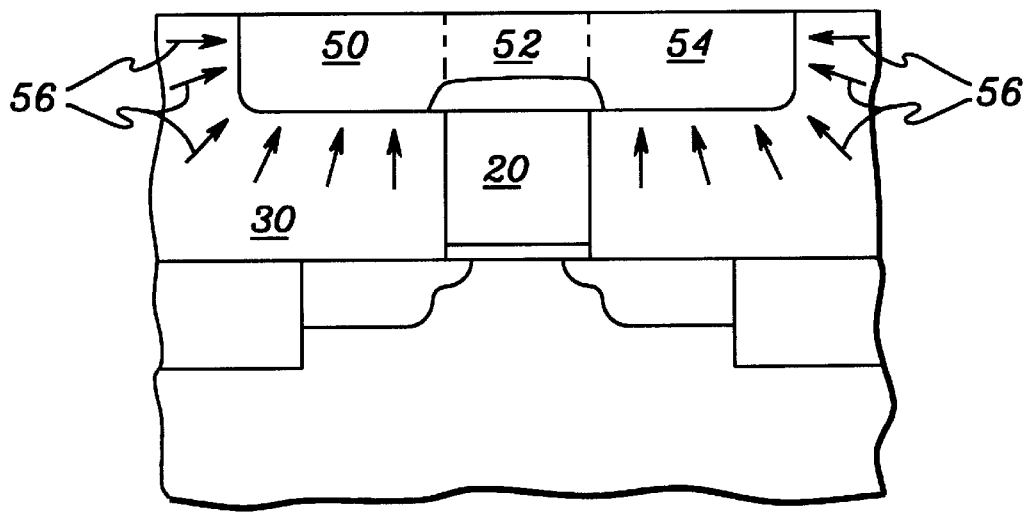
FIG. 5B is a cross-sectional view of the structure of FIG. 5A taken along line 5B—5B showing out-diffusion of dopant into the source region and drain region of the TFT.

In FIGS. 5A & 5B, CVD polysilicon has been deposited and chemical-mechanical polished back to the upper surface of nitride 24 and dielectric layer 30, so as to fill trench 40.

A source region 50, body region 52 and drain region 54 are then formed for the thin-film transistor by annealing the structure to out diffuse, for example, boron 56 from (in one embodiment) boron doped glass (BSG) 30. The result is that source region 50 and drain region 54 are self-aligned and the thin-film transistor has a planarized upper surface without any further processing being required. The source region and drain region of the thin-film transistor are self-aligned since a mask is not needed to create these regions. Note that channel region 52 remains undoped since gate 20 and gate oxide 42 function as a mask to prevent dopant 56 from the doped dielectric from out diffusing into this region.

The stacked transistor structure of FIGS. 5A & 5B has numerous advantages over prior stacked transistors. For example, the overlying thin-film transistor has a planarized upper surface and self-aligned source and drain regions in the semiconductor material. In addition, gate 20 is shared between the underlying field-effect transistor and the overlying thin-film transistor. At the thin-film transistor, gate 20 has a U-shaped wrap-around configuration so that the gate partially surrounds the channel region 52 in three dimensions. A "wrap-around" gate structure such as depicted herein will have much higher gate control and higher transconductance.

As noted above, thin-film transistor material is typically not single crystalline, having been formed by silicon materials such as micro-crystalline, polysilicon, or amorphous material, and would not have as good conductivity as that of a single crystalline device. Thus, a TFT has low on current. On the other hand, due to existing grain boundaries, the leakage current is inherently higher in a TFT than that of a single crystal transistor device. As a result, the off current is very high. The on-off current ratio of a conventional TFT device is generally poor, and may be in the range of 10E5 to 10E6. By using a wrap-around gate structure as disclosed herein, the TFT device will behave more like a silicon-on-insulator (SOI) structure to boost the on-off current ratio significantly. Since the performance is boosted, use of a stacked transistor structure as described herein in an SRAM array will allow for a lower standby current. For low power applications, e.g., supported by a battery, it is critical that the SRAM array have as low a standby current as possible.

In one embodiment, the stacked transistors of FIGS. 5A & 5B may comprise an underlying single crystal NMOS FET, and an overlying PMOS TFT. As shown in FIGS. 5A & 5B, the body of the PMOS TFT is embedded in the gate conductor, which is common to both the TFT and the underlying NMOS FET. The structure results in part from the damascene method of forming the body of the PMOS TFT. The gate conductor has a concave shape with respect to the body of the TFT, resulting in the above-described "wrap-around" configuration. The "wrap-around" gate provides better gate control of the electric potential in the body of the TFT, i.e., relative to existing TFT art which employs planar gates.

In prior thin-film transistors, achieving sufficiently low off current, good gate to source voltage slope and high on-current has been problematic. The body of a typical TFT contains silicon which greatly departs from mono-crystalline material. The concentration of grain boundaries (micro-crystalline) and silicon crystalline defects is much higher in a TFT, than in high-quality MOSFETs formed in a mono-crystalline substrate. As a result, the use of TFTs has been limited to applications for which these electrical paramaters are relatively unimportant.

In accordance with the present invention, the improved gate control of the "wrap-around" gate geomerty results in a reduced off-current, steeper sub-Vt slope (meaning better gate control in the turn-off region) and increased on-current than in the TFT structures. By comparing the drain current versus gate voltage characteristics of the present TFT with a typical TFT, a reduced off-current, better sub-Vt slope and higher on-current is evident. The improved electrical behavior of the "wrap-around" gate TFT makes it suitable for low power applications such as SRAM cells which must operate from battery backup.

In one variation to the above-described fabrication process, it is possible to create a shared gate having dual workfunctions. Specifically, a first gate conductor portion, associated with the underlying nFET, and a second gate conductor portion associated with the overlaying TFT can be formed. This optional process for defining nFET and pFET gate conductors of different workfunction can begin by recessing the n doped gate conductor (20 in FIG. 1A) for nMOS, and forming a layer of a conductive diffusion barrier (for example, TiN) on the exposed gate. A second gate conductor material is then deposited and polished, for example, to the surface of the BSG material. The polishing operation removes the conductive diffusion barrier from the top surface of the BSG. The second gate conductor portion is p+ doped and then recessed to a predetermined depth below the top surface of the doped dielectric (e.g., BSG). Thus, a gate stack is formed comprising a first n+ doped gate conductor portion separated by a conductive diffusion barrier from an overlying second p+ doped gate conductor portion. An exemplary embodiment of such a dual workfunction structure would be to use n+ polysilicon as the first gate conductor portion (for the nFET device) and p+ polysilicon as the second gate conductor portion (for the pFET device).

Figure 6:
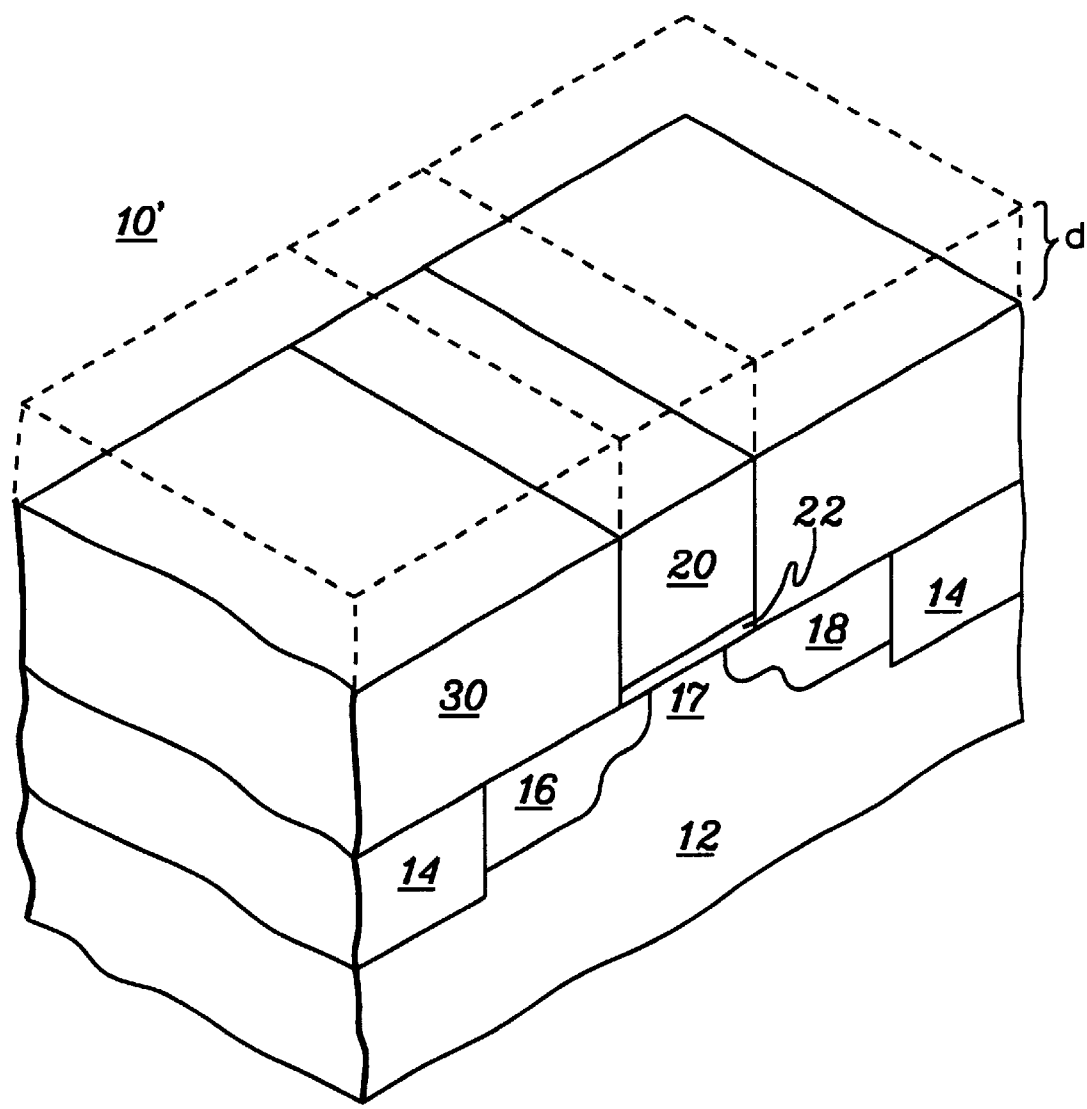
FIG. 6 is a partial perspective view of an intermediate structure employed in fabrication of an alternate embodiment of a TFT in accordance with the principles of the present invention.
Figure 7:
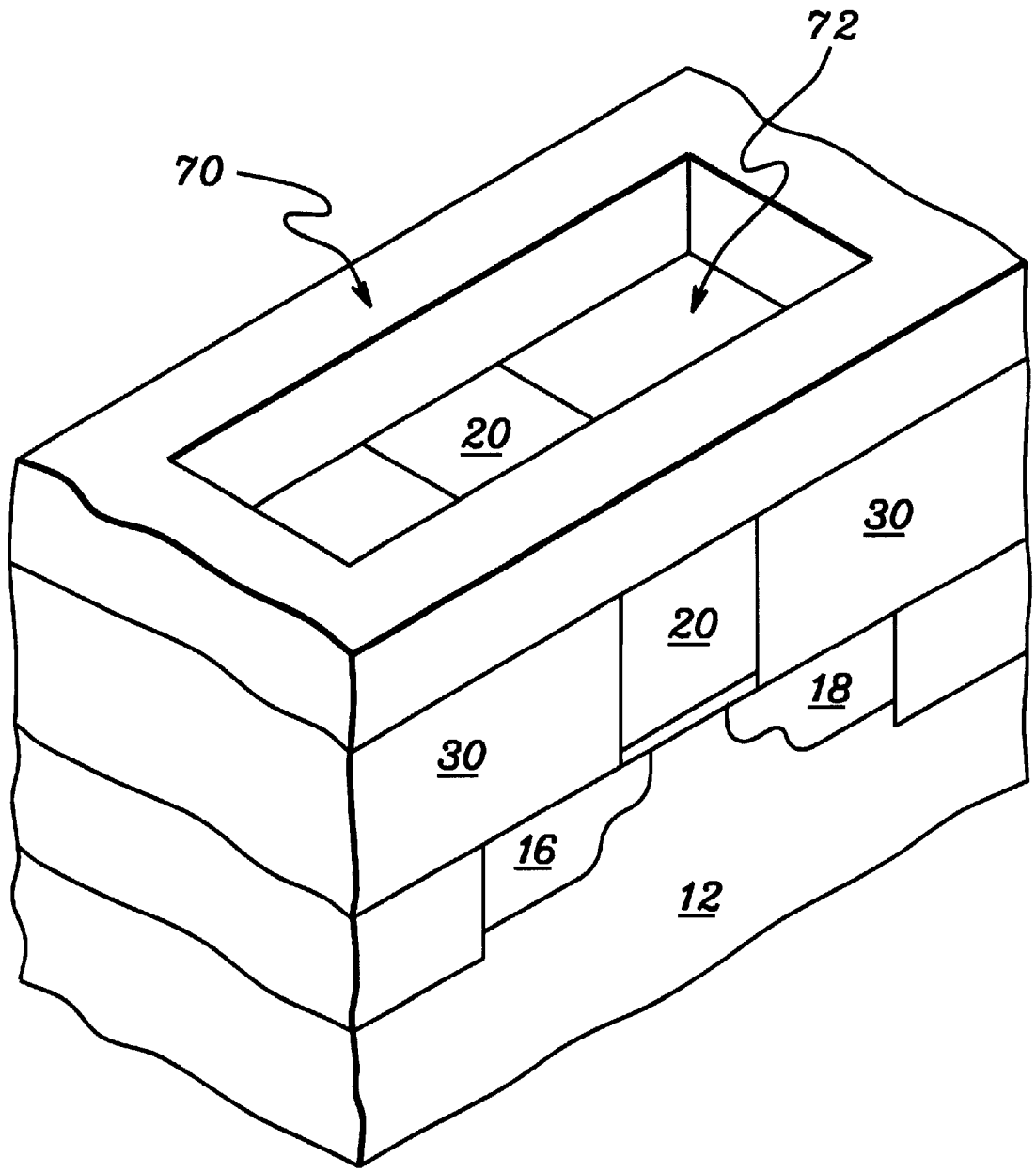
FIG. 7 is a partial perspective view of the structure of FIG. 6 after depositing a further dielectric layer and forming of a trench therein in accordance with the principles of the present invention.
Figure 8:
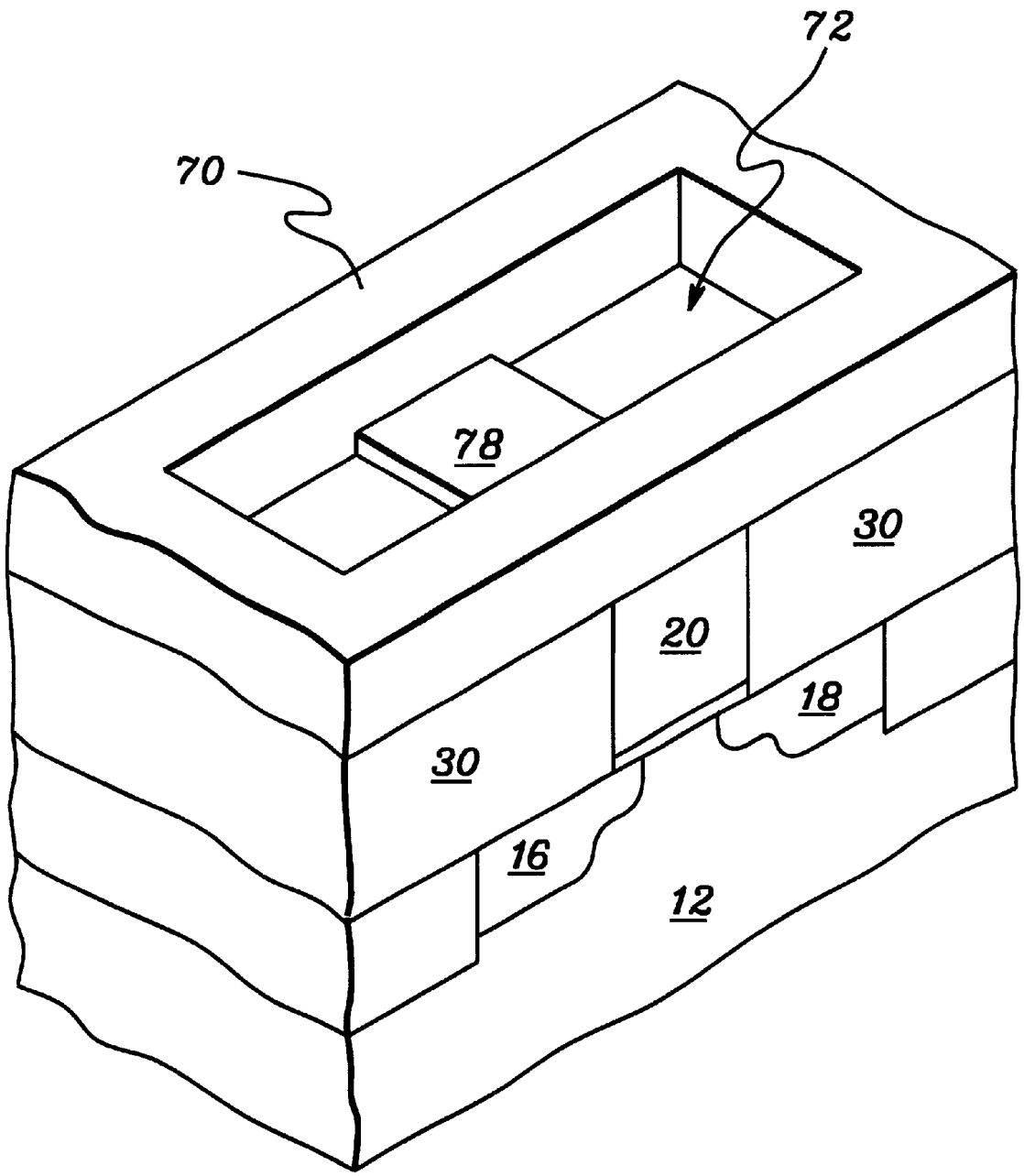
FIG. 8 is a partial perspective view of the structure of FIG. 7 after formation of a gate dielectric over the exposed gate structure.

FIGS. 6–9 depict an alternate embodiment for fabricating a stacked transistor structure in accordance with the present invention. In this embodiment, a planar gate structure for the TFT is created. FIG. 6 comprises the transistor structure of FIG. 2A after recessing the entire structure a distance "d". Distance "d" may be of varying depth, but a portion of gate 20 must remain after the removal of material. As shown in FIG. 7, a dielectric layer 70 is next blanket deposited on the recessed surface of the transistor structure and a trench 72 is formed within dielectric layer 70 exposing the planar upper surface of gate 20 and doped dielectric layer 30. In FIG. 8, a gate dielectric 78 has been formed by oxidation of the exposed polysilicon gate 20.

Figure 9A:
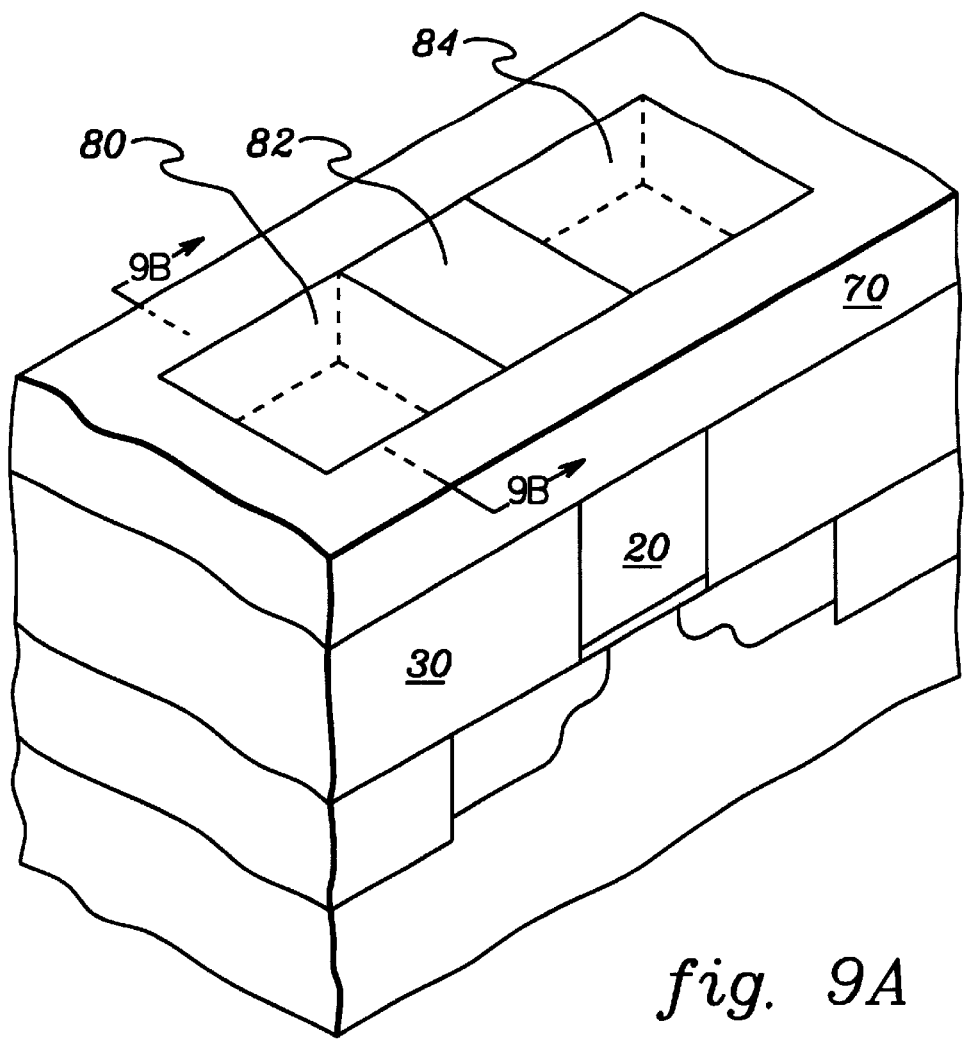
FIG. 9 is a partial perspective view of the structure of FIG. 8 after deposition and planarization of polysilicon to be employed in forming the TFT device in accordance with the principles of the present invention.
Figure 9B:
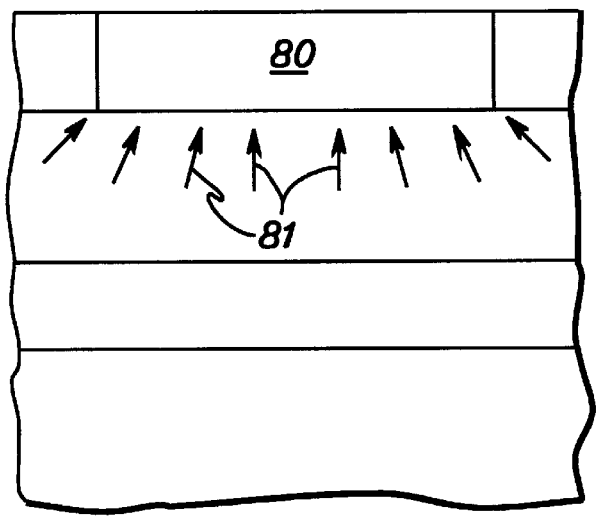

FIGS. 9A & 9B depict the resultant stacked transistor structure after polysilicon has been deposited within trench 72 and undergone chemical-mechanical planarization to form a planar upper surface. The regions of the TFT are again formed by out-diffusion of dopant 81 from doped dielectric 30. Therefore, the resultant source region 80 and drain region 84 are self-aligned. The body or channel region 82 of the thin-film transistor is masked from receiving dopant by the underlying gate structure 20. Although not possessing the control of the U-shaped wrap-round gate of FIGS. 5A & 5B, the resultant TFT overlying the underlying field-effect transistor does have numerous advantages, including a shared gate between the structures, a planarized upper surface (without requiring any additional processing steps) and a self-aligned source and drain region.

Figure 10A:
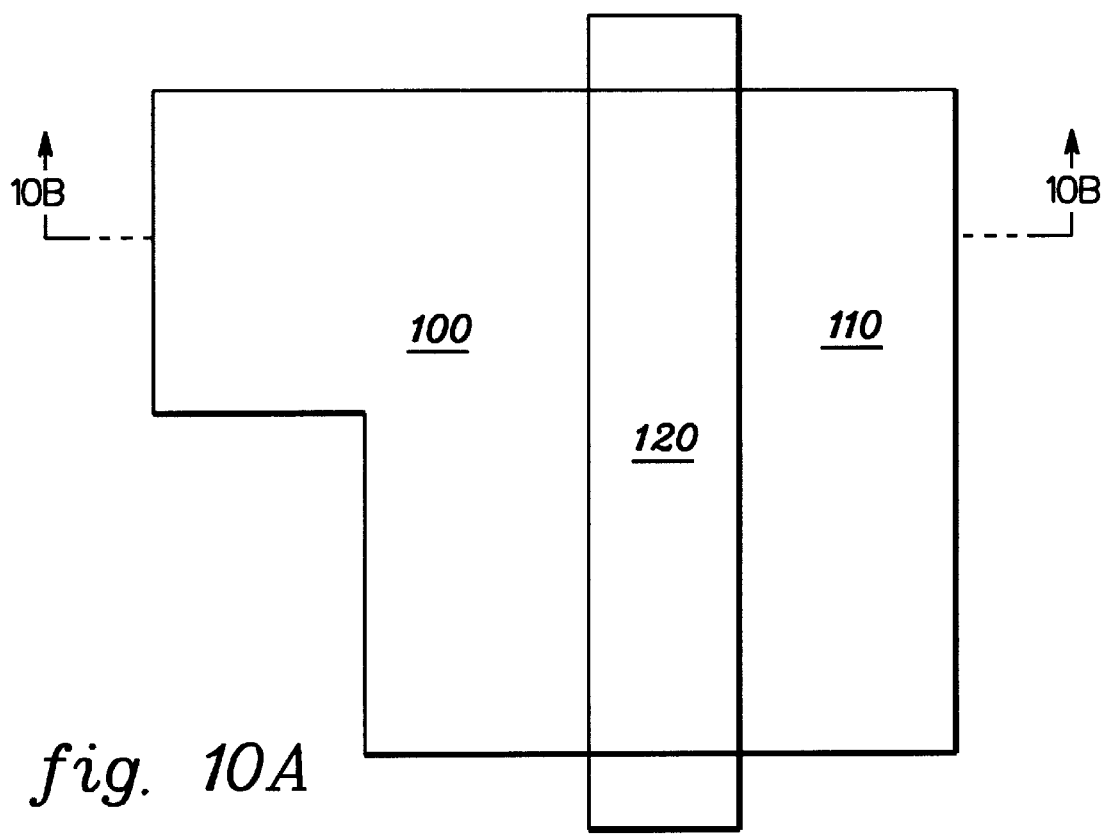
FIG. 10A is a plan view of one embodiment of a first field-effect transistor structure in accordance with the principles of the present invention.
Figure 10B:
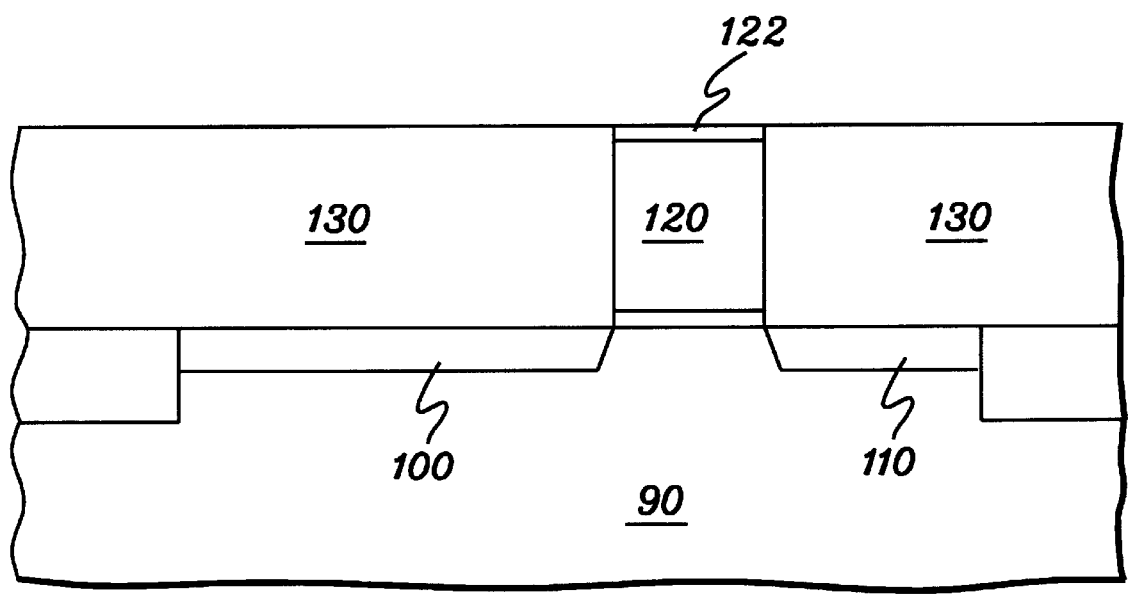
FIG. 10B is a cross-sectional elevational view of the structure of FIG. 10A taken along line 10B—10B.

In addition to disclosing the unique embodiments of FIGS. 5A & 9A, FIGS. 10A—15B describe various approaches for electrically interconnecting the overflying and underlying transistors. Referring initially to FIGS. 10A & 10B, a first field-effect transistor is shown formed in a semiconductor substrate 90. The transistor includes a source region 100, drain region 110 and a gate stack, which includes a gate 120, gate dielectric 121, and a protective dielectric cap 122. The gate structure is surrounded (see FIG. 10B) by a dielectric material 130.

FIGS. 11A—12B depict one approach for electrically connecting the aligned drain regions of the underlying and overlying transistors, while FIGS. 13A—14B depict an alternate embodiment for electrically interconnecting these structures. Note that the interconnection approaches described herein comprise only two embodiments for connecting these transistors, and the concepts disclosed hereinbelow can be readily applied to other connection configurations.

In the example presented, it is assumed that (1) a contact to the source of the underlying nMOS is needed (e.g., for connecting the source region to ground); (2) a contact to the source of the overlying TFT pMOS device is needed (e.g., for connecting that source region to a VDD power supply); and (3) the drains of the nMOS and the pMOS devices are to be connected together to form an inverter from the stacked transistors.

Figure 11A:
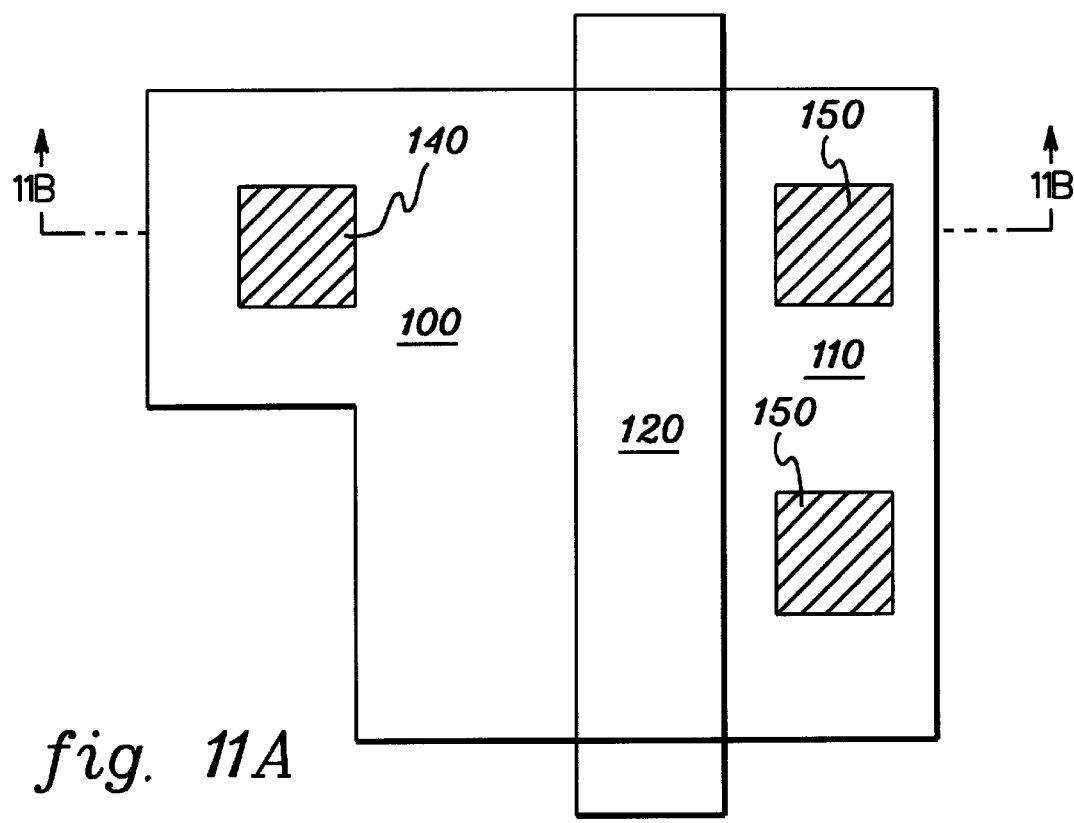
FIG. 11A is a plan view of the structure of FIG. 10A after formation of contact studs to the source and drain regions of the first field-effect transistor.
Figure 11B:
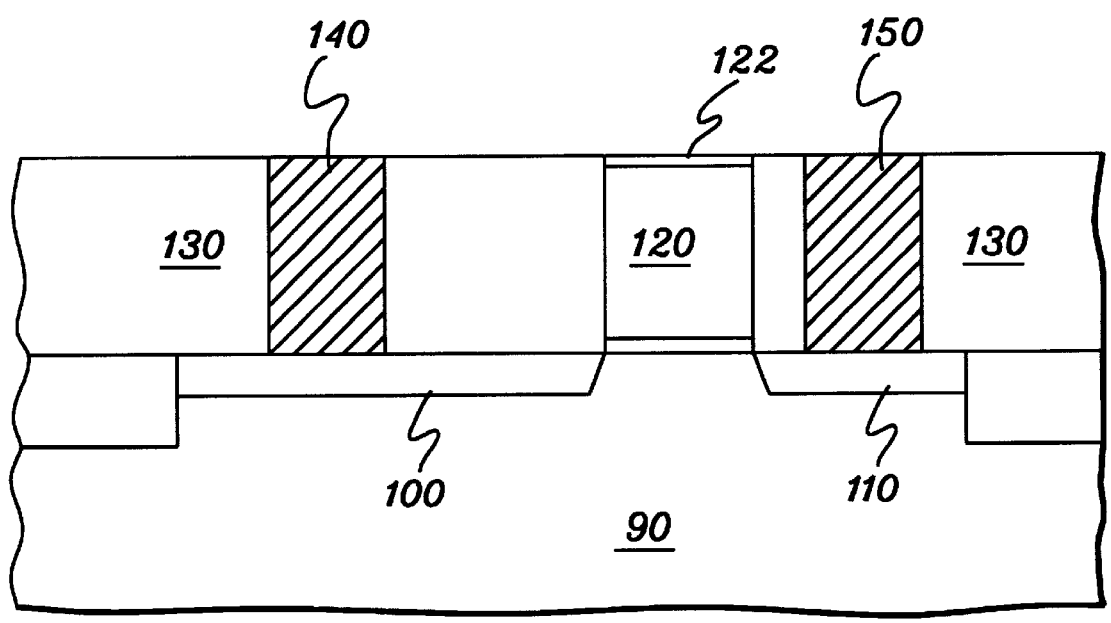
FIG. 11B is a cross-sectional elevational view of the structure of FIG. 11A taken along line 11B—11B.
Figure 12A:
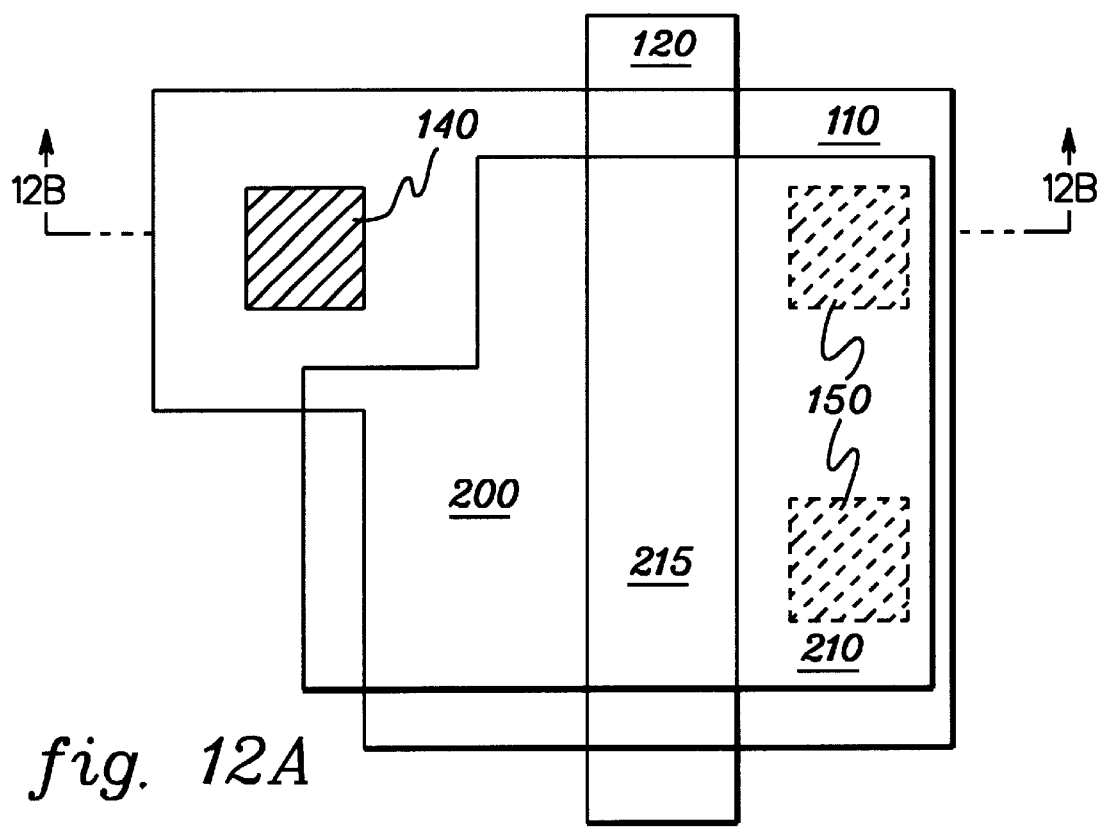
FIG. 12A is a plan view of the structure of FIG. 11A showing formation of a thin-film transistor atop the first field-effect transistor in accordance with the principles of present invention.
Figure 12B:
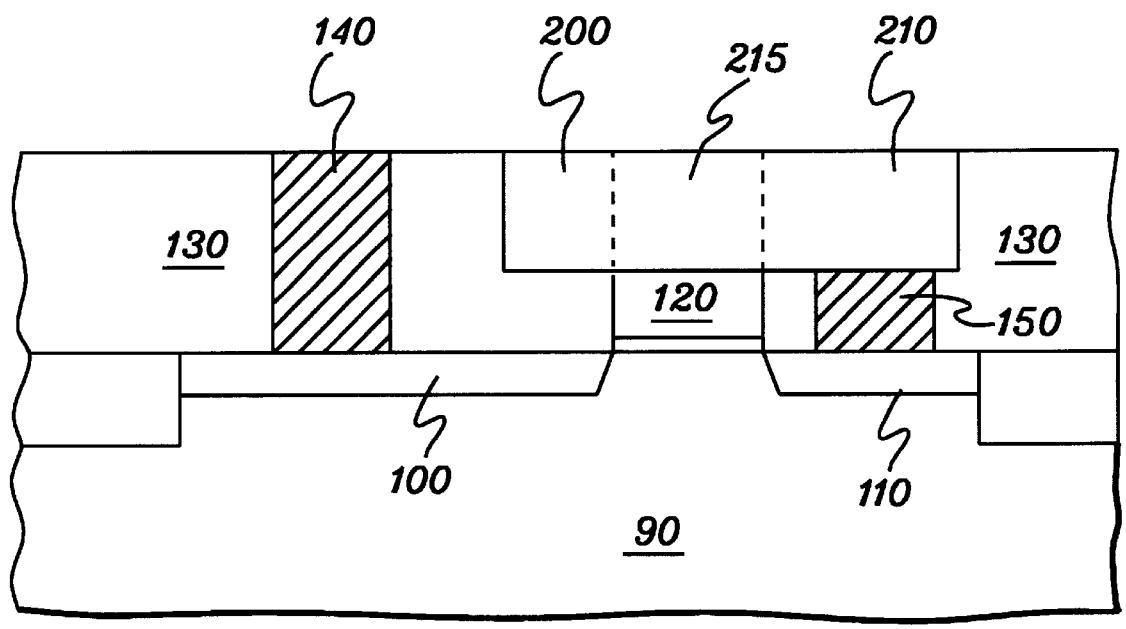
FIG. 12B is a cross-sectional elevational view of the structure of FIG. 12A taken along line 12B—12B.

In the approach of FIGS. 11A—12B, once the underlying nMOS device is completed, contacts are formed to the source and drain regions of this device. In FIGS. 11A & 11B, the source contact comprises a conductive post 140 which is shown to electrically connect to source region 100, while the drain contacts (of which there are two in this example) comprise conductive posts 150 which extend to the drain region 110. In one embodiment, conductive posts 140 & 150 may comprise tungsten studs. Next, an opening is patterned and a trench is formed in the structure of FIGS. 11A & 11B. Polysilicon is then deposited and the TFT is formed using out-diffusion of dopant from the dielectric layer 130 as described above. The resultant stacked transistor is depicted in FIGS. 12A & 12B where the TFT has a source region 200, body region 215 and a drain region 210, and gate 120 is shared between the underlying FET and the overlying TFT.

In defining the trench for the body of the TFT, a 1:1 etch-ratio of polysilicon to the insulating material can be employed. This will create a concave gate structure for the TFT device. For etching the tungsten post, it is not necessary to have a 1:1 etch-rate ratio. In other words, the tungsten height is not critical. After etching, a low-temperature oxidation is carried out to oxidize the polysilicon to form the gate for the TFT. At low temperature, for example, 600° C., the tungsten will not be oxidized. The final step is to deposit polysilicon, or micro-crystalline silicon, to fill the etched structure and a chemical-mechanical polish is carried out. Slight over polishing is desirable to insure that the contact stud on the source of the nMOS device is revealed. The result of this processing is that electrical connection is provided to source region 100; and drain regions 110 and 220 of the underlying and overlying transistors are electrically coupled by conductive plugs 150.

Figure 13A:
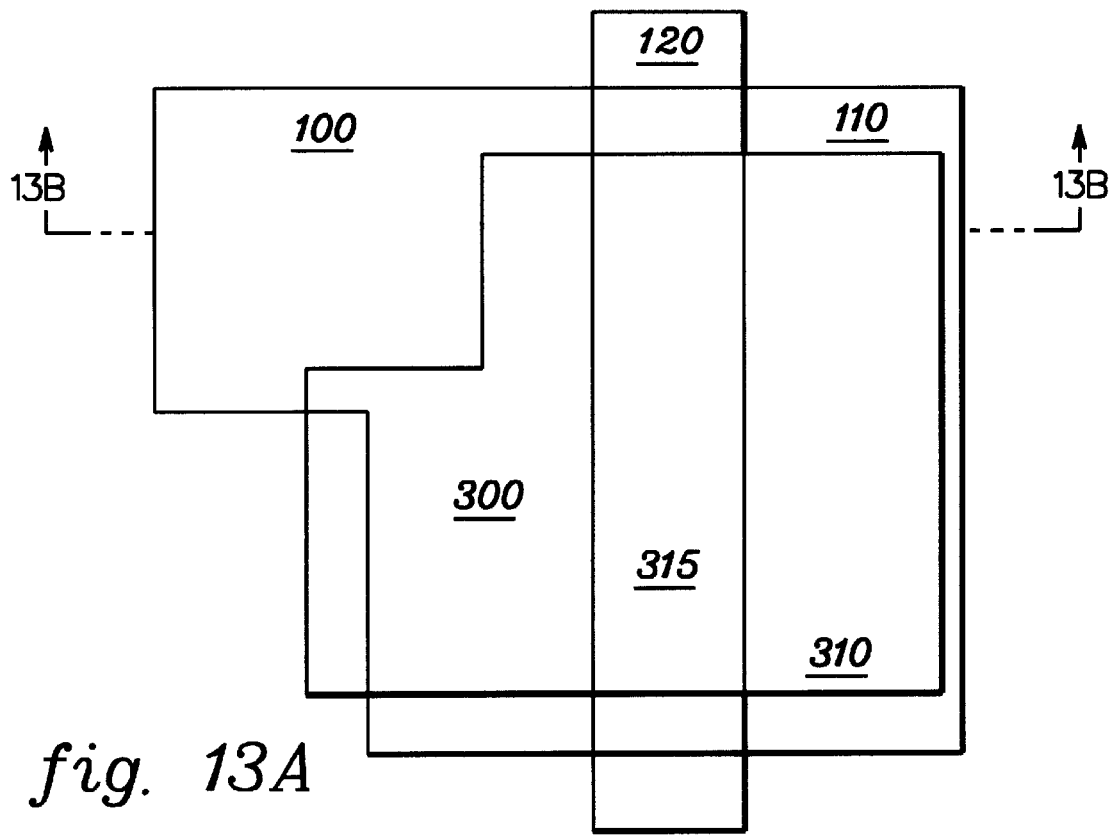
FIG. 13A is a plan view of a first and second transistor structure to be contacted in accordance with a further aspect of the present invention.
Figure 13B:
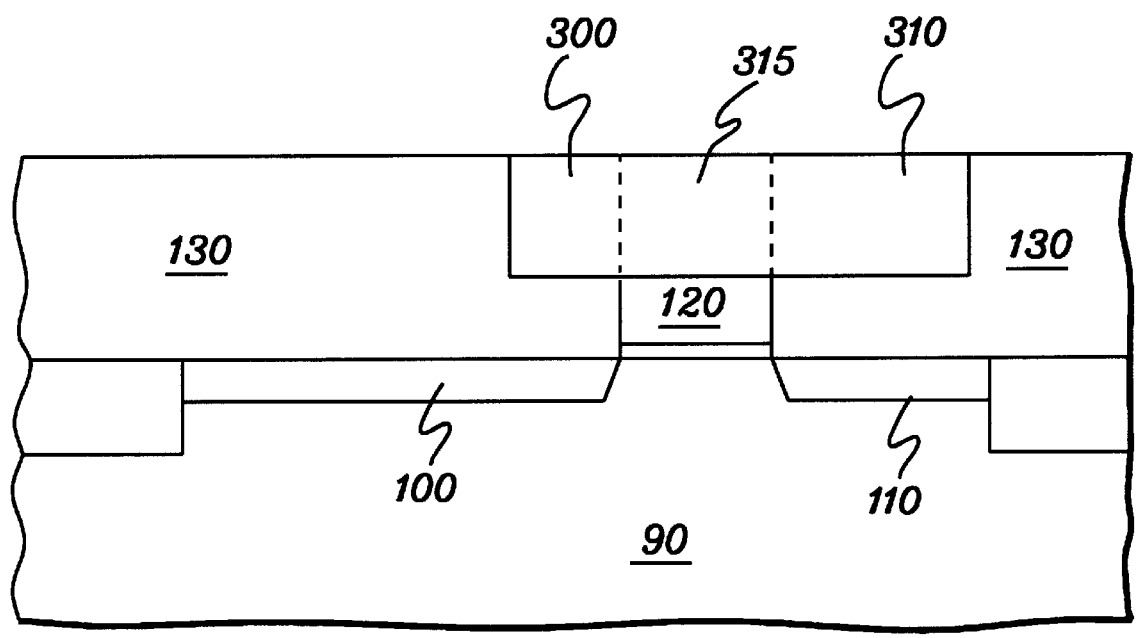
FIG. 13B is a cross-sectional elevational view of the structure of FIG. 13A taken along line 13B—13B.
Figure 14A:
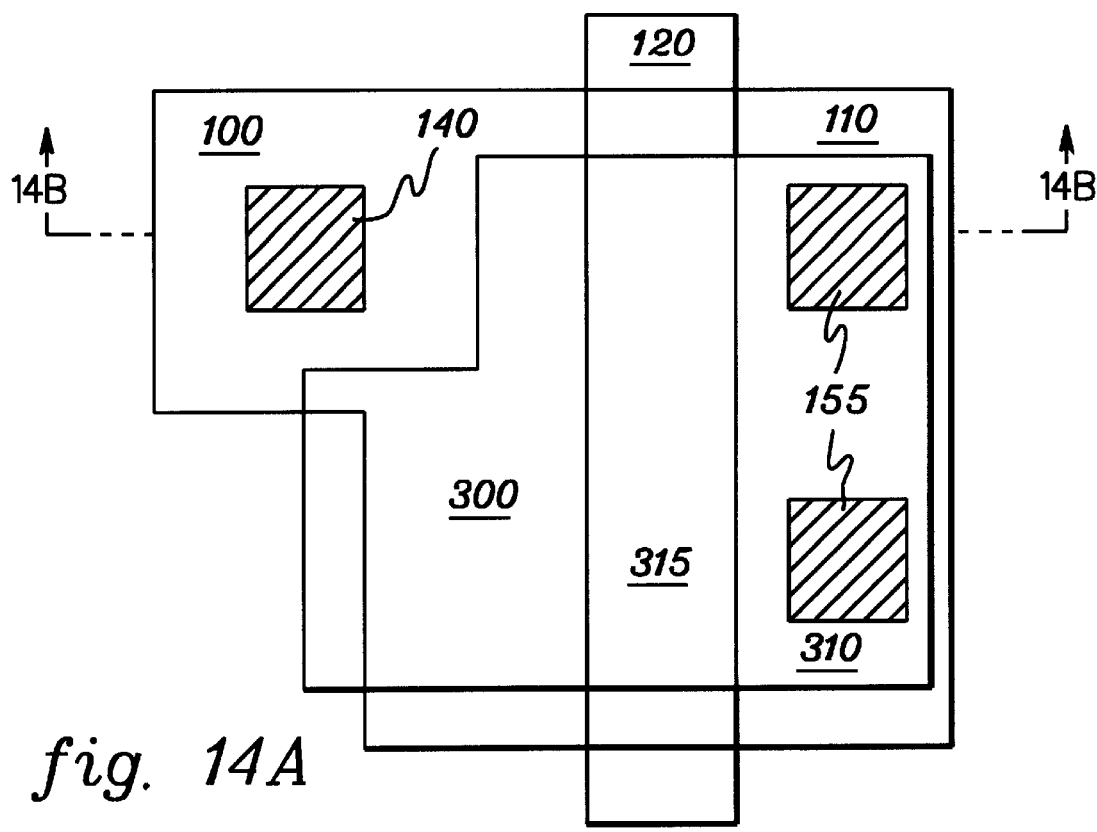
FIG. 14A is a plan view of the structure of FIG. 13A after formation of conductive contact posts to the source of the first transistor and to the drain of the first and second transistor.
Figure 14B:
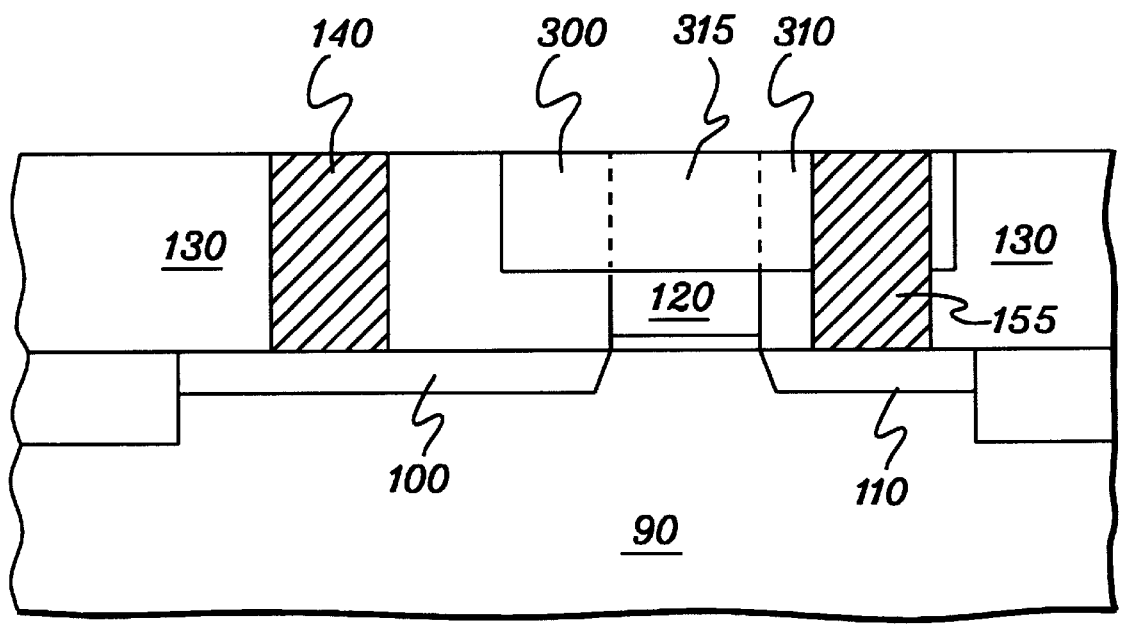
FIG. 14B is a cross-section elevational view of the structure of FIG. 14A taken along line 14B—14B.

As noted, FIGS. 13A—14B depict an alternate embodiment for electrically connecting the transistors. The same contact assumptions are made in this embodiment as stated above. The starting point for interconnecting the transistors is shown in FIGS. 13A & 13B, which in one embodiment, is substantially the same structure as depicted in FIGS. 5A & 5B. Specifically, the underlying transistor has a source region 100 and a drain region 110. The channel between regions 100 and 110 is gated by a gate 120 which is shared between the underlying transistor and an overlying TFT. The overlying TFT has a source region 300 and a drain region 310 separated by a body region 315. Once the stack structure is formed as depicted, contacts to the source of the underlying nMOS device, as well as contacts to form the interconnection of the drains of the nMOS and TFT pMOS can be accomplished simultaneously. This will require the same etch process described previously having a 1:1 etch rate ratio of polysilicon to insulating material. The contact to the bulk silicon region has the same height as the contact that joins the drains of the two devices. A standard contact forming process, for example, linear deposition, CVD tungsten deposition, followed by a chemical-mechanical polish to form the contacts can be employed. As shown in FIG. 14B, the result is a conductive post 140 which electrically connects to source region 100 of the underlying transistor, and one or more conductive posts 155 which electrically connect the drain region 310 of the TFT to drain region 110 of the underlying transistor. Note that in this embodiment conductive posts 155 directly pass through drain region 310 of the TFT.

Figure 15A:
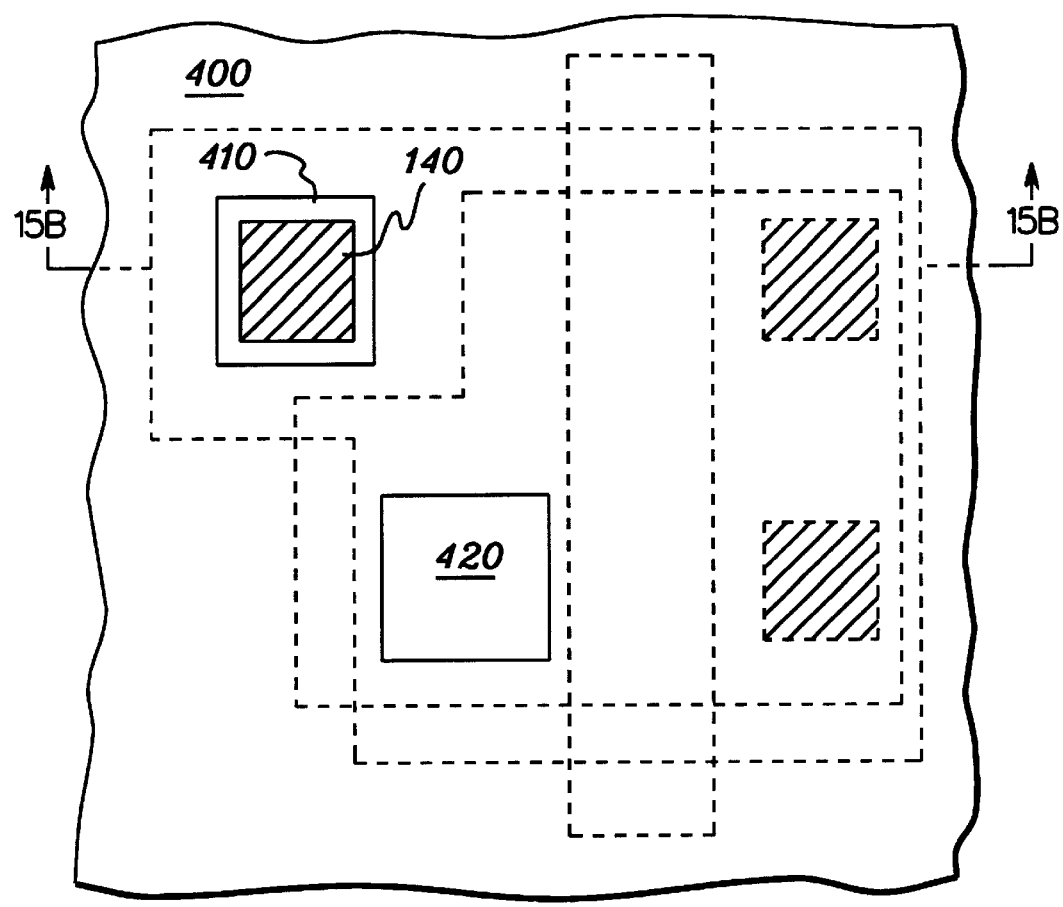
FIG. 15A is a plan view of the structure of FIG. 14A after formation and patterning of a dielectric layer atop the second field-effect transistor providing contact areas to contact the first source of the first field-effect transistor and the second source of the second field-effect transistor.
Figure 15B:
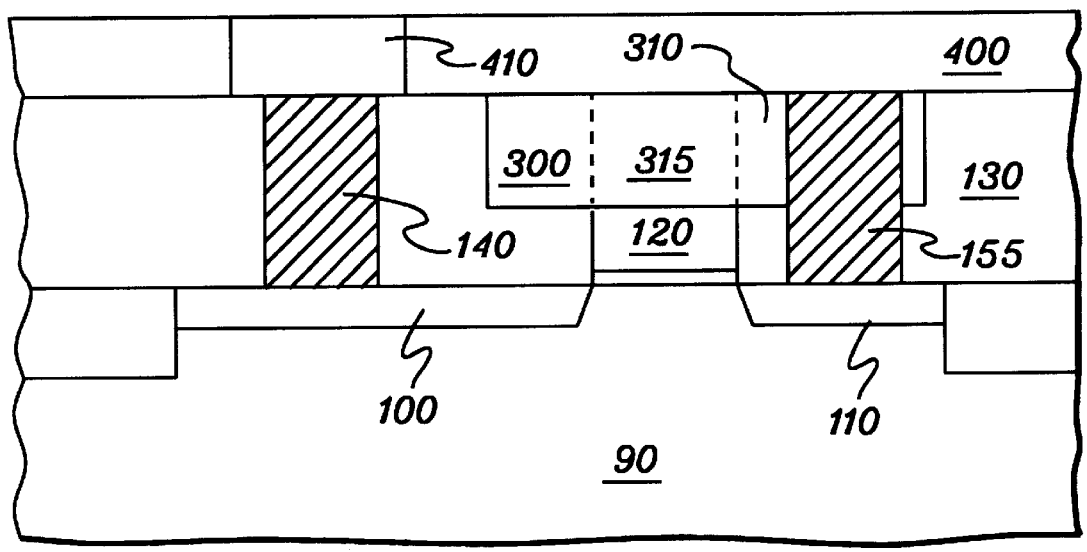
FIG. 15B is a cross-sectional elevational view of the structure of FIG. 15A taken along line 15B—15B.

FIGS. 15A & 15B depict a next level interconnect for the structure of FIGS. 11A—12B and the structure of FIGS. 13A–14B. In this embodiment, a dielectric layer 400 is formed over the structure, and a first opening 410 exposes the conductive stud 140 connected to source region 110 of the underlying transistor, while a second opening 420 exposes a portion of source region 300 of the TFT. Second level interconnect (not shown) can then be formed on top of dielectric 400 and within openings 410 & 420 to, for example, electrically connect source region 100 to ground, and source region 300 to VDD supply. In this embodiment, the interconnected drain regions of the two transistors are not connected to another level of interconnect.

Figure 16:
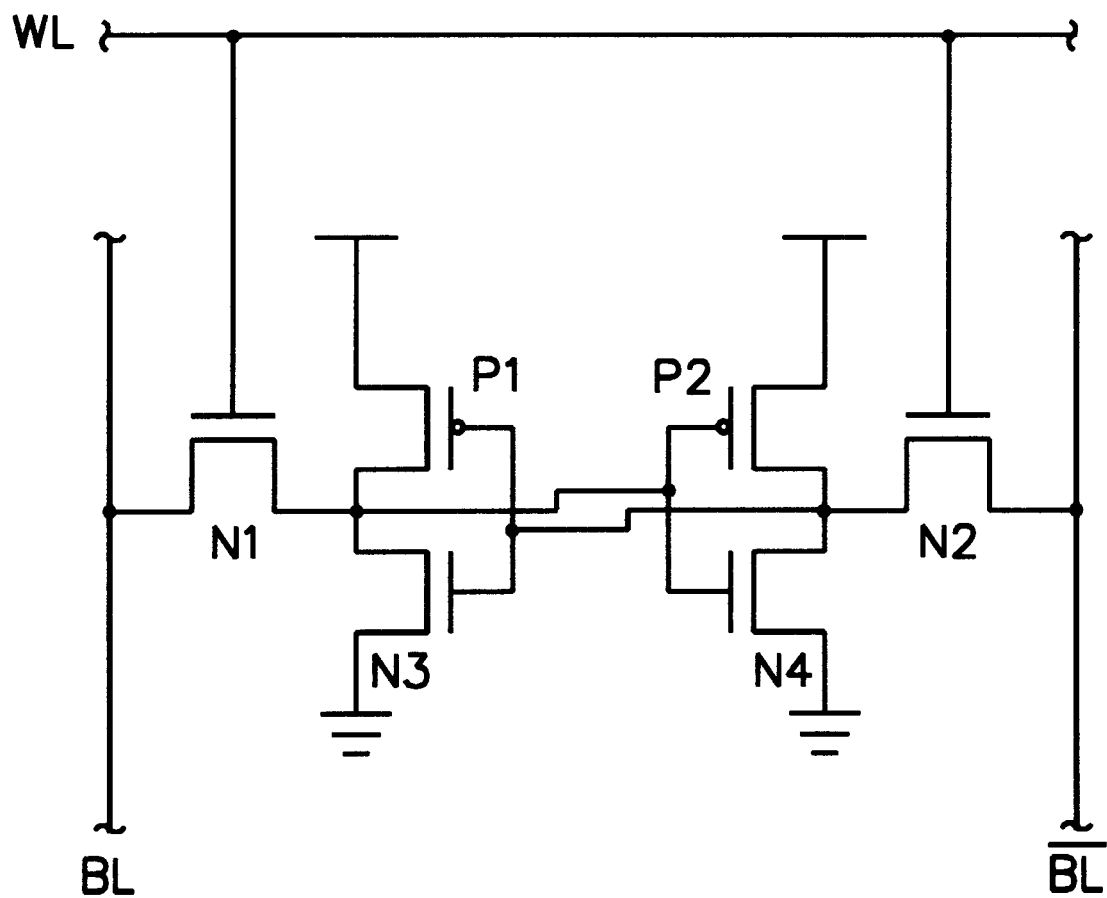
FIG. 16 is a schematic of one embodiment of an SRAM structure to employ stacked FETs fabricated in accordance with the principles of present invention.

The structures described hereinabove are particularly advantageous for use in an SRAM cell. FIG. 16 depicts one embodiment of an SRAM circuit which includes two transfer gates N1 and N2, two pull-up TFT devices P1 & P2, and two pull-down nMOS devices N3 & N4. Here, transistor P1 is built on top of transistor N3, and transistor P2 is built on top of transistor N4 in a manner as described above. Further, the drains of transistors P1 and N3 are electrically shorted, and the drains of transistors P2 and N4 are electrically shorted. Although depicted herein in connection with an SRAM cell, those skilled in the art will recognize that the stacked transistor structure described above can be employed in other integrated circuits.

While the invention has been described in detail herein in accordance with certain preferred embodiments thereof, many modifications and changes therein may be affected by those skilled in the art. Accordingly, it is intended by the appended claims to cover all such modifications and changes as fall within true spirit and scope of the invention.

What is claimed is:

1. A semiconductor device comprising:
   a first field-effect transistor comprising a first source, a first drain and a gate;
   a second field-effect transistor comprising a second source, a second drain and said gate, wherein said gate is shared by said first field-effect transistor and said second field-effect transistor, and wherein said gate comprises a U-shaped wrap-around gate at a body of said second field-effect transistor; and
   wherein said second source and said second drain are self-aligned to said gate in a layer of planarized semiconductor above said first field-effect transistor.

2. The semiconductor device of claim 1, wherein said first field-effect transistor comprises an n-type field-effect transistor (nFET) and said second field-effect transistor comprises a p-type field affect transistor (pFET).

3. The semiconductor device of claim 1, wherein the planarized semiconductor layer comprises a damascene layer, having been formed via a damascene process.

4. The semiconductor device of claim 1, wherein the second field-effect transistor resides at least partially over the first field-effect transistor, and wherein the semiconductor device further comprises at least one conductive post disposed between and electrically connecting the first drain of the first field-effect transistor and the second drain of the second field-effect transistor.

5. The semiconductor device of claim 1, wherein said second field-effect transistor comprises a thin-film transistor.

6. The semiconductor device of claim 5, wherein said body, said second source and said second drain are co-planar.

7. The semiconductor device of claim 6, wherein the planarized semiconductor layer comprises one of micro-crystalline, polysilicon, or amorphous material.

8. The semiconductor device of claim 1, wherein the first field-effect transistor comprises a pull-down transistor, and the second field-effect transistor comprises a pull-up transistor, said pull-down transistor and said pull-up transistor comprising part of a static random access memory (SRAM) cell.

9. The semiconductor device of claim 8, wherein said first field-effect transistor comprises an underlying single crystal nMOSFET, and said second field-effect transistor comprises an overlying pMOS thin-film transistor (TFT).

10. The semiconductor device of claim 1, wherein the shared gate comprises a first gate conductor portion and a second gate conductor portion, and wherein the first gate conductor portion and the second gate conductor portion have a first workfunction and a second workfunction, respectively.

11. The semiconductor device of claim 10, wherein the first gate conductor portion and the second gate conductor portion are separated by a conductive diffusion barrier, and wherein the first gate conductor portion comprises a first conductive type and the second gate conductor portion comprises a second conductive type.

12. The semiconductor device of claim 11, wherein the first conductive type comprises n+ polysilicon and the second conductive type comprises p+ polysilicon.

13. A semiconductor device comprising:
    a first field-effect transistor comprising a first source, a first drain and a gate;
    a second field-effect transistor comprising a second source, a second drain and said gate, wherein said gate is shared by said first field-effect transistor and said second field-effect transistor;
    wherein said second source and said second drain are self-aligned to said gate in a layer of planarized semiconductor above said first field-effect transistor; and
    further comprising a doped insulator layer underneath and surrounding multiple sides of the second field-effect transistor, wherein the second source and the second drain are formed by out diffusion of dopant from the doped insulator layer underneath the second field-effect transistor, and wherein a body of the second field-effect transistor is protected from the out diffusion by said gate.

14. A semiconductor device comprising:
    a first field-effect transistor comprising a first source, a first drain, and a gate;
    a second field-effect transistor comprising a second source, a second drain and said gate, wherein said gate is shared by said first field-effect transistor and said second field-effect transistor, and
    wherein said gate comprises a U-shaped wrap-around gate at a body of said second field-effect transistor.

15. The semiconductor device of claim 14, wherein said second source and said second drain are self-aligned to said gate, and wherein said semiconductor device further comprises a doped insulator layer surrounding said second field-effect transistor, said second source and said second drain being formed by out diffusion of dopant from said doped insulator layer.

16. The semiconductor device of claim 14, wherein the second field-effect transistor comprises a thin-film transistor.

17. The semiconductor device of claim 16, wherein said second field-effect transistor overlies said first field-effect transistor, and wherein said first field-effect transistor comprises a pull-down transistor, and said second field-effect transistor comprises a pull-up transistor of a static random access memory (SRAM) cell.

18. The semiconductor device of claim 17, wherein said first field-effect transistor comprises a single crystalline metal-oxide semiconductor field-effect transistor (MOSFET), and said second field-effect transistor comprises one of a micro-crystalline, polysilicon, or amorphous MOSFET.

19. The semiconductor device of claim 14, wherein the second field-effect transistor is at least partially aligned over the first field-effect transistor, and wherein the semiconductor device further comprises at least one conductive post disposed between and electrically connecting said first drain and said second drain.

20. The semiconductor device of claim 19, wherein said at least one conductive post electrically connects said second drain to said first drain and passes through said second drain.

21. The semiconductor device of claim 14, wherein the shared gate comprises a first gate conductor portion and a second gate conductor portion, and wherein the first gate conductor portion and the second gate conductor portion have a first workfunction and a second workfunction, respectively.

22. The semiconductor device of claim 21, wherein the first gate conductor portion and the second gate conductor portion are separated by a conductive diffusion barrier, and wherein the first gate conductor portion comprises a first conductive type and the second gate conductor portion comprises a second conductive type.

23. The semiconductor device of claim 22, wherein the first conductive type comprises n+ polysilicon and the second conductive type comprises p+ polysilicon.

24. A semiconductor device comprising:
  a masking structure;
  a semiconductor material layer disposed over the masking structure;
  a doped dielectric layer adjacent to said semiconductor material layer;
  wherein said semiconductor material layer is doped self-aligned to said masking structure from said doped dielectric layer;
  wherein the masking structure comprises a gate of a field-effect transistor, and said semiconductor material layer comprises a body, a source diffusion and a drain diffusion of said field-effect transistor; and
  wherein said gate comprises a U-shaped wrap-around gate at a body of the field-effect transistor.

25. The semiconductor device of claim 24, wherein the semiconductor material layer has a planar surface, and wherein said source diffusion and said drain diffusion are self-aligned to said gate.

26. The semiconductor device of claim 24, wherein said semiconductor material layer comprises a damascene layer on said masking structure and said doped dielectric layer, said damascene layer having been formed via a damascene process.

27. The semiconductor device of claim 24, wherein the field-effect transistor comprises a thin-film transistor overlying another field-effect transistor.

28. The semiconductor device of claim 27, wherein the thin-film transistor comprises a p-type field-effect transistor, and the another field-effect transistor comprises an n-type field affect transistor.

29. The semiconductor device of claim 27, wherein said U-shaped wrap-around gate is shared by said thin-film transistor and said another field-effect transistor.

* * * * *